(12) United States Patent
Dudeck et al.

(10) Patent No.: US 7,177,212 B2
(45) Date of Patent: Feb. 13, 2007

(54) METHOD AND APPARATUS FOR REDUCING LEAKAGE CURRENT IN A READ ONLY MEMORY DEVICE USING SHORTENED PRECHARGE PHASE

(75) Inventors: Dennis E. Dudeck, Hazelton, PA (US); Donald Albert Evans, Lancaster, OH (US); Richard Joseph McPartland, Nazareth, PA (US); Hai Quang Pham, Hatfield, PA (US)

(73) Assignee: Agere Systems Inc., Allentown, PA (US)

( * ) Notice: Subject to any disclaimer, the term of this patent is extended or adjusted under 35 U.S.C. 154(b) by 101 days.

(21) Appl. No.: 10/764,150

(22) Filed: Jan. 23, 2004

(65) Prior Publication Data

US 2005/0162951 A1    Jul. 28, 2005

(51) Int. Cl.
*G11C 7/12* (2006.01)
(52) U.S. Cl. .................. 365/203; 365/94; 365/104
(58) Field of Classification Search .................. 365/94, 365/104
See application file for complete search history.

(56) References Cited

U.S. PATENT DOCUMENTS

| | | | |
|---|---|---|---|
| 3,848,236 A * | 11/1974 | Troutman | 365/204 |
| 4,833,653 A * | 5/1989 | Mashiko et al. | 365/203 |
| 4,849,935 A * | 7/1989 | Miyazawa | 365/189.05 |
| 5,303,194 A * | 4/1994 | Suzuki | 365/203 |
| 5,673,231 A * | 9/1997 | Furutani | 365/203 |
| 5,703,816 A * | 12/1997 | Nam et al. | 365/200 |
| 5,914,903 A * | 6/1999 | Kanma et al. | 365/203 |
| 6,307,797 B1 * | 10/2001 | Fournel et al. | 365/203 |
| 6,430,099 B1 * | 8/2002 | Rogenmoser et al. | 365/203 |
| 6,459,615 B1 | 10/2002 | McPartland et al. | 365/185.1 |
| 6,512,700 B1 | 1/2003 | McPartland et al. | 365/185.28 |
| 6,580,637 B2 * | 6/2003 | Pascucci | 365/185.11 |
| 6,901,016 B2 * | 5/2005 | Miyashita et al. | 365/203 |
| 6,990,034 B2 * | 1/2006 | Ashizawa | 365/227 |

* cited by examiner

*Primary Examiner*—Tan T. Nguyen

(57) ABSTRACT

A method and apparatus are provided for reducing leakage current in a read only memory device. Leakage current is reduced by reducing the duration of the precharge cycle during each read cycle so that the associated leakage current will flow for a shorter time period during each cycle. The precharge phase is positioned at the beginning of each read cycle, prior to the evaluation phase. The precharge phase is terminated by a subsequent clock edge or by an internal time out prior to a subsequent clock edge. The time interval between when the columns reach their precharge voltage and the evaluation phase begins is reduced.

6 Claims, 3 Drawing Sheets

METHOD AND APPARATUS FOR REDUCING LEAKAGE CURRENT IN A READ ONLY MEMORY DEVICE USING SHORTENED PRECHARGE PHASE

CROSS-REFERENCE TO RELATED APPLICATION

The present application is related to U.S. patent application Ser. No. 10/764,152, entitled "Method and Apparatus for Reducing Leakage Current in a Read Only Memory Device Using Pre-Charged Sub-Arrays," and U.S. patent application Ser. No. 10/764,000, entitled "Method and Apparatus for Reducing Leakage Current in a Read Only Memory Device Using Transistor Bias," each filed contemporaneously herewith and incorporated by reference herein.

FIELD OF THE INVENTION

The present invention relates generally to electronic memory devices, and more particularly to the reduction of leakage current in electronic memory devices comprised of arrays of transistors.

BACKGROUND OF THE INVENTION

Data storage devices, such as read only memories ("ROMs"), typically store data in arrays of memory cells. Generally, a memory cell consists of a single transistor for each bit to be stored. The memory array is typically permanently programmed during the fabrication process. Thus, ROM memory devices are generally used to store data or code that will not be altered after the ROM memory device is manufactured. Non-volatile ROM memory devices, such as electrically erasable programmable ROMs (EEPROMs), are capable of maintaining stored information even in the absence of power.

ROM memory devices are often fabricated, for example, using Complementary Metal Oxide Semiconductor (CMOS) semiconductor fabrication technologies. As the size of ROM memory devices decrease, with improvements in integrated circuit fabrication technologies, the more narrow trace widths and shorter channel lengths of the ROM memory cell transistors can cause high leakage currents, referred to as transistor sub-threshold leakage current. In previous CMOS technologies, where trace widths were on the order 0.16 micrometers ($\mu m$) or more, transistor sub-threshold leakage current was much lower, even for relatively short channel length and narrow width devices. ROM memories fabricated using these prior CMOS technologies typically did not suffer from significant leakage problems.

With more advanced CMOS technologies having trace widths of 0.16 $\mu m$ or less, however, the transistor sub-threshold leakage current becomes a significant problem. A number of techniques have been proposed or suggested for reducing transistor sub-threshold leakage current in CMOS transistors, including the use of relatively long channel length or relatively wider channel width cell transistors (or both). Such techniques, however, cause an undesirable increase in the physical size of the memory device, reduce the maximum frequency of operation and increase the active and standby currents. A need therefore exists for improved techniques for reducing leakage current in ROM devices.

SUMMARY OF THE INVENTION

Generally, a method and apparatus are provided for reducing leakage current in a read only memory device. The present invention reduces leakage current by reducing the duration of the precharge cycle during each read cycle so that the associated leakage current will flow for a shorter time period during each cycle. The precharge phase is positioned at the beginning of each read cycle, prior to the evaluation phase (unlike conventional techniques where the precharge phase occurs after the evaluation phase). The precharge phase is terminated by a subsequent clock edge or by an internal time out prior to a subsequent clock edge.

With the precharge phase positioned prior to the evaluation phase in each read cycle, the time interval between when the columns reach their precharge voltage and the evaluation phase begins is reduced. This time interval may correspond to a substantial portion of the precharge phase of the read cycle or to a longer "standby" interval. Among other benefits, the reading operation of the present invention provides for faster operation and lower active current due to the smaller capacitances associated with smaller cell transistors. In addition, the power supply voltage drop is reduced due to high leakage current, thereby improving performance and reducing the need for wider power supply buses.

A more complete understanding of the present invention, as well as further features and advantages of the present invention, will be obtained by reference to the following detailed description and drawings.

DETAILED DESCRIPTION

Figure 1:
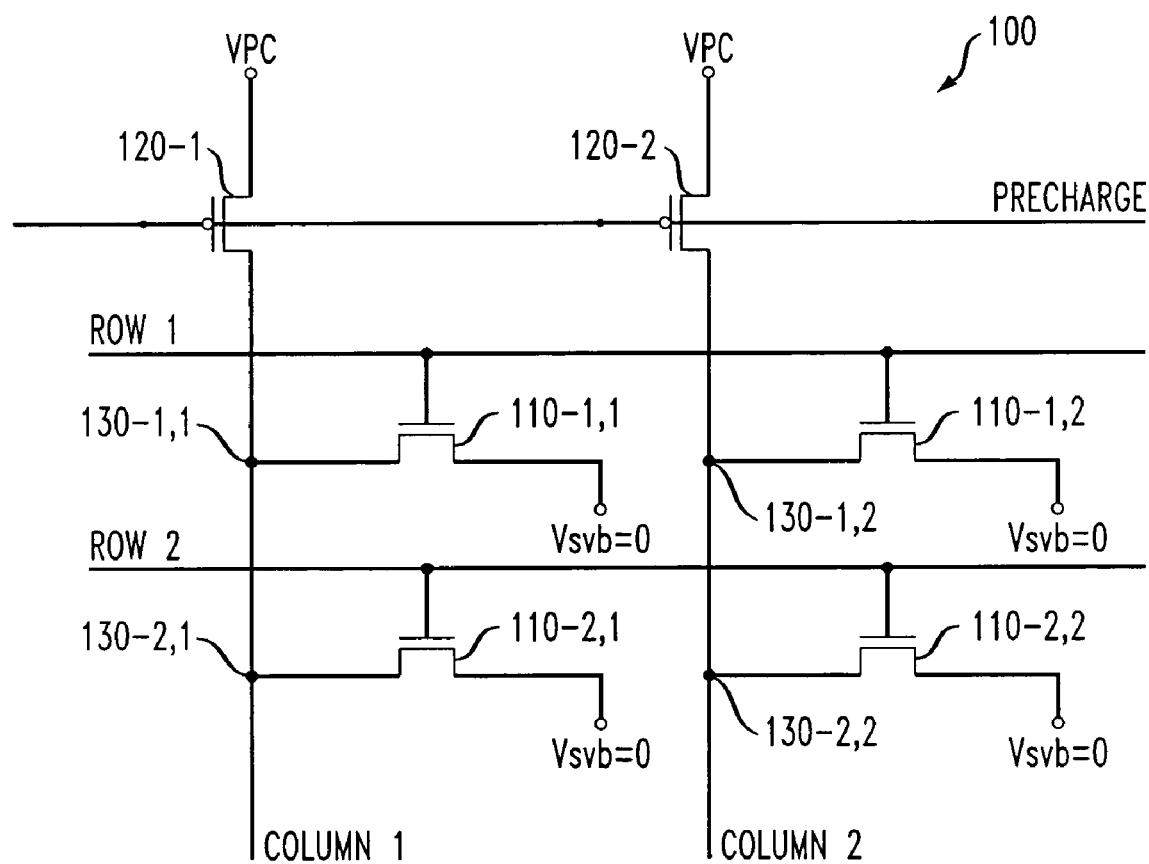
FIG. 1 illustrates a conventional array of n-channel memory cells for a read only memory device.

FIG. 1 illustrates a conventional ROM memory cell array with column precharge transistors that may be, for example, part of an integrated circuit. The memory cell transistors are n-channel transistors. The precharge transistors are p-channel devices. This type of ROM array is referred to as an "n-channel" array. There is also an analogous "p-channel" ROM memory array (not shown) where the cell transistors are p-channel transistors and the precharge transistors are n-channel transistors. For clarity, unless otherwise specified, all references and specified voltages here within apply to n-channel ROM memory arrays.

FIG. 1 illustrates a conventional n-channel two by two ROM array 100 of memory cells 110-1,1 through 110-i,j. The memory cells 110-1,1 through 110-i,j are generally comprised of n-channel transistors generally arranged in a grid pattern having a plurality (or series) of rows and columns. As shown in FIG. 1, the exemplary ROM array 100 includes a plurality, i, of rows (i=2), and a plurality, j, of columns (j=2). Each memory cell 110 has an associated programmable contact window 130-i,j that may optionally be programmed during the fabrication process.

Each column is supplied with power (VPC) at a first predetermined voltage level, often referred to as the "pre-charged voltage level," and each row is supplied with power at a second predetermined voltage level. Values for these first and second predetermined voltage levels typically depend upon the selected ROM implementation. For example, when the transistors 110 of the array 100 are n-channel (n-channel array), the column is typically pre-charged to a first predetermined voltage level substantially equal to the power supply voltage ("$V_{DD}$") or another selected pre-charged positive voltage level, while the second predetermined voltage level is typically ground or zero volts ("VSS"). When the transistors 110 of the array 100 are p-channel (p-channel array), the column is typically pre-charged to the first predetermined voltage level substantially equal to a ground potential, zero volts ("VSS") or another selected pre-charged voltage level below $V_{DD}$, while the second predetermined voltage level is substantially equal to the power supply voltage $V_{DD}$.

A gate of each transistor 110 of a ROM array 100 is connected to a particular row of the series of rows. A source of each transistor is generally connected to the source voltage bus, and a drain of each transistor is or is not connected to a particular column of the series of columns, depending upon how the cell 110 is to be programmed. The ROM array 100 is programmed during fabrication by the presence or absence of such a drain-to-column connection (a drain-to-column "contact window"). As indicated above, each column of the series of columns is typically pre-charged to a first predetermined voltage potential referred to as the "pre-charged voltage level", VPC. This voltage level is different than that of the source voltage bus, Vsvb. VPC is typically $V_{DD}$ for an n-channel array and VSS for a p-channel array. The voltage of the source voltage bus, Vsvb, for an n-channel array is typically 0 volts ("VSS"). The voltage of the source voltage bus, Vsvb, for a p-channel array is typically the power supply voltage, $V_{DD}$. The column residing at the pre-charge voltage represents a first logical state such referred to as a "1" data state or a first data state, and is subject to operation of its associated transistor(s).

The memory cells of a ROM array are typically prepro-grammed via the presence or absence of a contact window between their transistor drains and their corresponding columns, while all sources are coupled to the source voltage bus. All columns are pre-charged to the pre-charged voltage level VPC using p-channel precharge transistors 120. When a "1" data state is desired for a particular bit stored on a particular transistor, no contact is made between that transistor drain and its corresponding column (i.e., absence of the contact window). As a consequence, the column continues to maintain its pre-charged voltage when a row connected to that transistor gate (i.e., a corresponding row) is activated, given the absence of a drain contact to the column. In contrast, when a second logical state referred to as a "0" data state or a second data state is desired for the particular bit stored on a particular transistor, given that its drain is coupled to its corresponding column via the contact window, when the row connected to that transistor gate (i.e., a corresponding row) is activated and the transistor conducts, that column voltage is moved or pulled to the potential of the source voltage bus. That column, therefore, does not maintain its pre-charged voltage level associated with the logical high or first data state, but now represents a logical low or second data state.

To obtain information from a ROM, by a "Read" operation, a row is typically activated. All transistors along that row are activated via their respective gates. Along the activated row, all of the transistors that have been programmed to a "0" data state move their respective columns towards Vsvb potential. All transistors that have been programmed to a "1" data state will not change the voltage of their associated columns. Their column voltages remain at VPC. The different voltage levels, VPC and Vsvb, are sensed from selected columns, such as for a byte or word of information, using sense amplifiers. Even though all of the columns along a row are activated, only some of the columns are "selected" for output; that is, their data represented by their corresponding voltage levels are forwarded to the output of the memory. The selected columns are typically arranged in a periodic order throughout the population of columns (e.g., reading from every eighth column). A particular data word is selected through appropriately addressing a selected row and selected columns.

Leakage Current in ROM Devices

A read memory cycle in conventional ROM devices 100 includes an evaluation phase followed by a precharge phase. The high leakage currents in CMOS technologies are encountered during the precharge portion of the memory cycle. During precharge, the columns of the memory array are typically charged to a predetermined voltage (such as $V_{DD}$), for example, by supplying current to each column through an associated precharge transistor. For the remainder of the precharge phase, the precharge transistors will supply current to counteract any current leakage from the columns in order to maintain their voltage at the precharged level. The predominant leakage path can be subthreshold leakage through all "programmed" cell transistors connected to all of the columns. During the precharge phase, these cell transistors have their gates biased to keep the transistors in the off state. However, given the high subthreshold leakage current in state-of-the-art CMOS technologies and the large numbers of cell transistors attached to a typical column (128 to 1024), total subthreshold column leakage current can be significant. Furthermore, memory arrays typically have many columns (64 to 1024) so that the memory array subthreshold leakage current due to all the cell transistors attached to all the columns can be excessive. This leakage current is also present during standby periods where the memory is idle, i.e., not being read, but keep precharged so it is available for reading.

According to one aspect of the present invention, leakage current in ROM devices is reduced by reducing the duration of the precharge cycle. Thus, the ROM devices of the present invention will still experience leakage current, but only over shorter durations. While a precharge cycle for conventional ROM devices may be longer than one-half cycle in duration, the present invention allows the precharge cycle to be shorter than one-half cycle in duration. In addition, the present invention positions the precharge phase at the beginning of each read cycle, prior to the evaluation phase (unlike conventional techniques where the precharge occurs after the evaluation phase). Thus, the present invention further reduces the time interval between when the columns reach their precharge voltage and the evaluation phase begins. This time interval may correspond to a substantial portion of the precharge phase of the read cycle or to a longer "standby" interval. It is during this time interval that ROM cell transistor subthreshold leakage current generally occurs.

ROM Read Cycles

Figure 2:
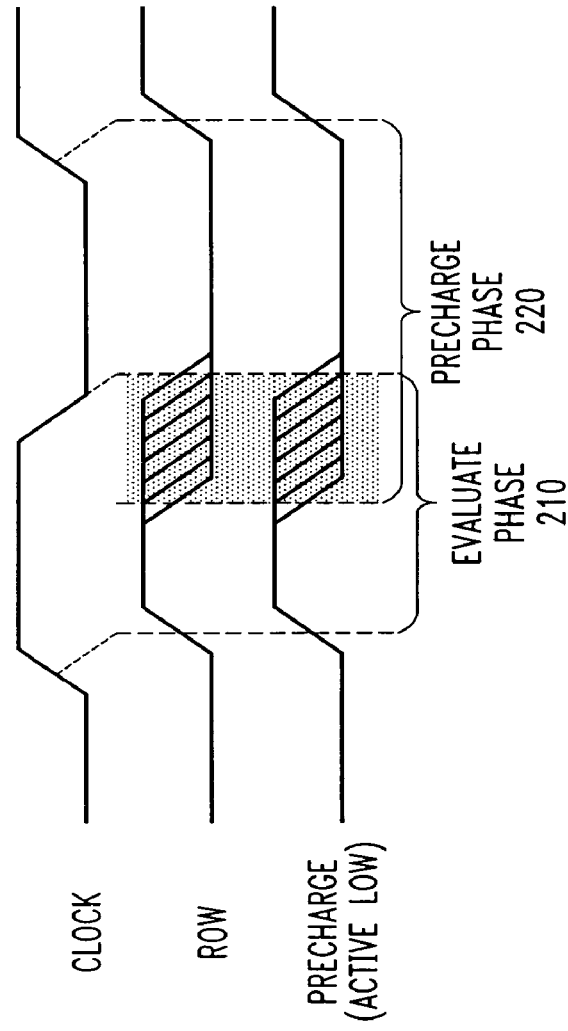
FIG. 2 illustrates the relative timing for the clock, row and precharge signals for a conventional read operation in a ROM device, such as the ROM device of FIG. 1.

As previously indicated, a ROM memory read cycle may be divided into two phases, the evaluation phase and the precharge phase. FIG. 2 illustrates the relative timing for the clock, row and precharge signals for a conventional read operation in a ROM device, such as the ROM device 100. As shown in FIG. 2, in a conventional ROM memory read cycle, the evaluation phase 210 is followed by the precharge phase 220. During a conventional read cycle, before a read cycle begins, all columns in a ROM array have been precharged, at the end of the prior cycle, to a predetermined voltage (typically $V_{DD}$). At the beginning of a read cycle, during the evaluation phase, a single row is then activated, turning on all ROM cell transistors along that row (one cell transistor per column). Those cell transistors 110 that are "programmed" will conduct current from the column to the source voltage bus (ground), changing the column voltage towards the source voltage bus potential (ground). Those cells 110 that are not programmed cannot conduct current from the column to ground because their drain is unconnected. The columns associated with these cells 110 remain substantially at the precharge voltage level.

As indicated above, subthreshold leakage current of programmed memory cell transistors 110 can drain charge from the columns to the source voltage bus (ground) during the precharge phase and after the columns have reached their precharged voltage (typically $V_{DD}$). This charge must be replenished from the precharge power supply ($V_{DD}$) in order to maintain the required column precharge voltage. With conventional ROM read cycles, the precharge phase 220 is typically one half or more of the cycle time. If the end of the evaluation phase 210 is defined by a clock edge, the precharge phase 220 is one-half cycle in duration. If the evaluation phase 210 is internally timed out, a common technique, the precharge phase 220 will be greater than one-half cycle in duration. In this case, subthreshold leakage current during precharge occurs for a longer portion of the clock cycle.

Figure 3:
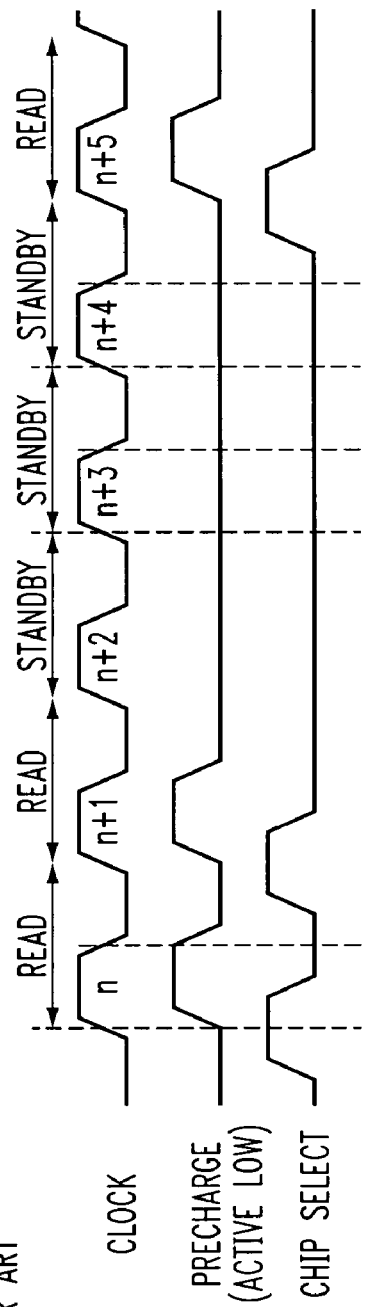
FIG. 3 illustrates the relative timing for the clock, precharge and chip select signals for sequential read and standby memory cycles in a conventional ROM memory device, such as the ROM device of FIG. 1.

FIG. 3 illustrates the relative timing for the clock, precharge and chip select signals for sequential read and standby memory cycles in a conventional ROM memory device, such as the ROM device 100. As shown in FIG. 3, when the memory 100 is inactive but maintaining its readiness to read (standby mode), the columns are actively maintained at precharge voltage. In this case, there can be high leakage current from the precharge power supply through the columns and their programmed cell transistors 110 to the source voltage bus (ground). This is due to high subthreshold leakage current of "programmed" cells.

Shortening of Precharge Phase

The present invention reduces the duration of the precharge phase so that the associated leakage current will flow for a shorter time period during each cycle. This is accomplished by either (1) moving the precharge phase to the beginning of the read cycle and terminating it by a clock edge, or (2) moving the precharge phase to the beginning of the read cycle and internally timing out the precharge phase prior to the subsequent clock edge. When the precharge phase is moved to the beginning of the read cycle and is terminated by a clock edge, the precharge phase will last for substantially one-half of the cycle time. The present invention thus reduces the duration of precharge leakage current in comparison to conventional ROM read cycle techniques where the evaluation phase is internally timed out to be less than one-half a cycle in duration.

When the precharge phase is moved to the beginning of the read cycle and is internally timed out (i.e., when the cells have charged up to $V_{DD}$), prior to the subsequent clock edge, the precharge phase will be less than one-half the cycle time. This case is most effective in reducing the duration of precharge leakage current. For this case, precharge duration, and the duration of associated precharge leakage current, is always less than in conventional techniques. This is true for read cycles with or without intervening "standby" time (see FIG. 5).

Figure 4:
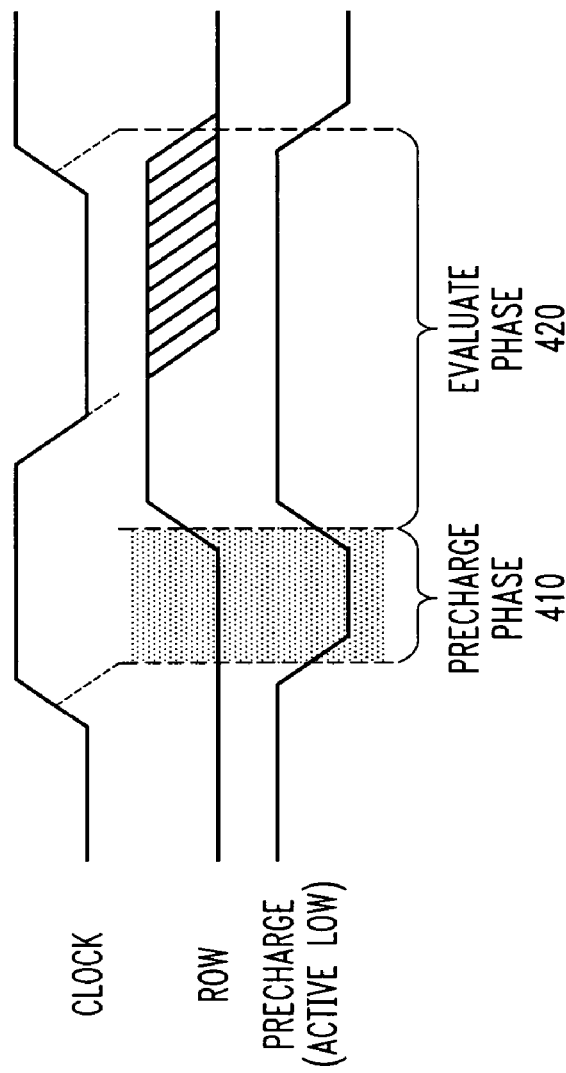
FIG. 4 illustrates the relative timing for the clock, row and precharge signals for a read operation in a ROM device incorporating features of the present invention.

FIG. 4 illustrates the relative timing for the clock, row and precharge signals for a read operation in a ROM device that incorporates features of the present invention. As shown in FIG. 4, in a ROM memory read cycle according to the present invention, the precharge phase 410 is followed by the evaluation phase 420.

Figure 5:
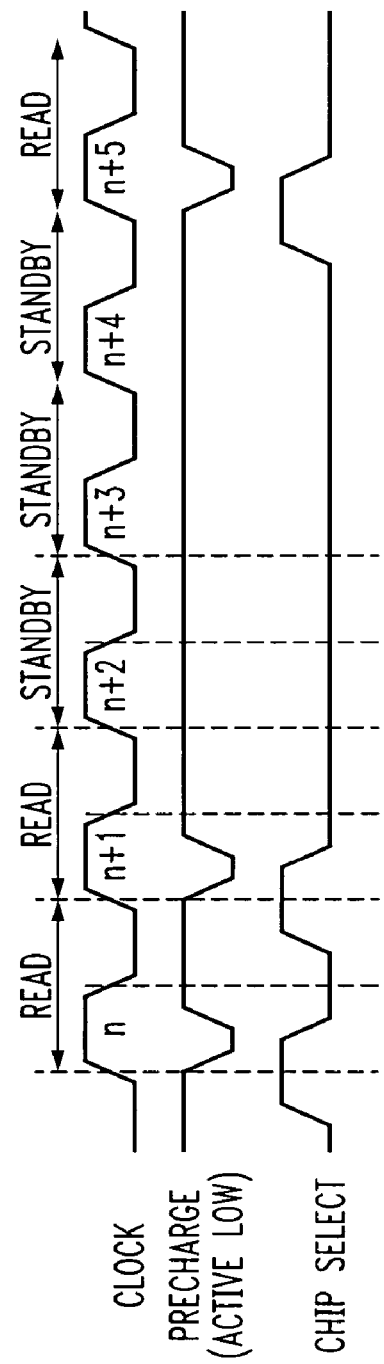
FIG. 5 illustrates the relative timing for the clock, precharge and chip select signals for sequential read and standby memory cycles in a ROM device incorporating features of the present invention.

FIG. 5 illustrates the relative timing for the clock, precharge and chip select signals for sequential read and standby memory cycles in a ROM memory device incorporating features of the present invention. As shown in FIG. 5, when the memory is inactive but maintaining its readiness to read (standby mode), the columns are not actively maintained at precharge voltage. In other words, the precharge signal is activated only during a read cycle. Thus, leakage current from the precharge power supply through the columns and their programmed cell transistors 110 to the source voltage bus (ground) is significantly reduced.

Thus, when there is a "standby" or idle time between read cycles, as shown in FIG. 5, the precharge duration, and the duration of associated precharge leakage current, is reduced by the present invention.

It is to be understood that the embodiments and variations shown and described herein are merely illustrative of the principles of this invention and that various modifications may be implemented by those skilled in the art without departing from the scope and spirit of the invention.

We claim:

1. A method for reducing leakage current in a read only memory device, comprising the step of:
   precharging at least one memory column in said read only memory device during a precharge phase of each read cycle, wherein at least one memory column is not precharged during a standby phase.

2. The method of claim 1, further comprising the step of terminating said precharge phase by a clock edge.

3. The method of claim 1, wherein said precharge phase is internally timed out prior to a subsequent clock edge.

4. A read only memory device comprised of memory columns that are connected to a precharge power supply during a precharge portion of each read cycle and are not connected to a precharge power supply during a standby mode.

5. The read only memory device of claim 4, wherein said read only memory device is further configured to terminate said precharge phase by a clock edge.

6. The read only memory device of claim 4, wherein said precharge phase is internally timed out prior to a subsequent clock edge.

* * * * *